US005879827A

United States Patent [19]
Debe et al.

[11] Patent Number: 5,879,827
[45] Date of Patent: Mar. 9, 1999

[54] CATALYST FOR MEMBRANE ELECTRODE ASSEMBLY AND METHOD OF MAKING

[75] Inventors: Mark K. Debe, Stillwater; Gregory M. Haugen, Edina; Andrew J. Steinbach, St. Paul; John H. Thomas, III, Mahtomedi, all of Minn.; Raymond J. Ziegler, Glenwood City, Wis.

[73] Assignee: Minnesota Mining and Manufacturing Company, St. Paul, Minn.

[21] Appl. No.: 948,910

[22] Filed: Oct. 10, 1997

[51] Int. Cl.[6] ...................................................... H01M 4/86
[52] U.S. Cl. .......................... 429/40; 204/279; 204/280; 204/290 R; 428/195; 428/202; 428/201; 428/209; 428/221; 428/323; 428/327; 428/336; 428/338; 428/357; 428/364; 428/372; 428/378
[58] Field of Search ................................. 429/40, 41, 42, 429/44; 204/279, 280, 290 R; 428/195, 201, 202, 209, 221, 323, 327, 336, 338, 357, 364, 372, 378

[56] References Cited

U.S. PATENT DOCUMENTS

| | | | |
|---|---|---|---|
| 3,442,715 | 5/1969 | Yee et al. | 136/122 |
| 3,676,222 | 7/1972 | Deibert | 136/121 |
| 3,969,545 | 7/1976 | Slocum | 427/163 |
| 4,148,294 | 4/1979 | Scherber et al. | 126/270 |
| 4,155,781 | 5/1979 | Diepers | 148/175 |
| 4,209,008 | 6/1980 | Lemkey et al. | 126/452 |
| 4,215,183 | 7/1980 | MacLeod | 429/30 |
| 4,252,843 | 2/1981 | Dorer et al. | 427/162 |
| 4,252,865 | 2/1981 | Gilbert et al. | 428/611 |
| 4,259,209 | 3/1981 | Nakane et al. | 252/430 |
| 4,340,276 | 7/1982 | Maffitt et al. | 350/164 |
| 4,396,643 | 8/1983 | Kuehn et al. | 427/160 |
| 4,539,256 | 9/1985 | Shipman | 428/315.5 |
| 4,550,123 | 10/1985 | Lopatin et al. | 521/64 |
| 4,557,957 | 12/1985 | Manniso | 428/36 |
| 4,568,598 | 2/1986 | Bilkadi et al. | 428/141 |
| 4,654,281 | 3/1987 | Anderman et al. | 429/209 |
| 4,720,400 | 1/1988 | Manniso | 427/243 |
| 4,726,989 | 2/1988 | Mrozinski | 428/315.5 |
| 4,731,310 | 3/1988 | Anderman et al. | 429/194 |
| 4,735,875 | 4/1988 | Anderman et al. | 429/194 |
| 4,791,037 | 12/1988 | Anderman | 429/195 |
| 4,812,352 | 3/1989 | Debe | 428/142 |
| 4,826,554 | 5/1989 | McIntyre et al. | 156/280 |
| 4,849,311 | 7/1989 | Itoh et al. | 429/192 |
| 4,853,305 | 8/1989 | Anderman et al. | 429/212 |
| 4,863,813 | 9/1989 | Kyer | 429/33 |
| 4,867,881 | 9/1989 | Kinzer | 210/490 |
| 4,910,099 | 3/1990 | Gottesfeld | 429/13 |
| 4,957,943 | 9/1990 | McAllister et al. | 521/64 |
| 4,992,126 | 2/1991 | Door | 156/182 |
| 5,039,561 | 8/1991 | Debe | 427/255.6 |
| 5,120,594 | 6/1992 | Mrozinski | 428/195 |
| 5,138,220 | 8/1992 | Kirkpatrick | 213/309 |
| 5,143,805 | 9/1992 | Anderman et al. | 429/217 |
| 5,162,167 | 11/1992 | Minh et al. | 429/30 |
| 5,176,786 | 1/1993 | Debe | 156/600 |
| 5,238,729 | 8/1993 | Debe | 428/245 |
| 5,260,360 | 11/1993 | Mrozinski et al. | 425/95 |
| 5,264,299 | 11/1993 | Krasij et al. | 429/30 |
| 5,277,996 | 1/1994 | Marchetti et al. | 429/44 |
| 5,308,465 | 5/1994 | Hillrichs et al. | 204/283 |
| 5,326,619 | 7/1994 | Dower et al. | 428/164 |
| 5,334,292 | 8/1994 | Rajeshwar et al. | 204/59 |
| 5,336,558 | 8/1994 | Debe | 428/323 |
| 5,338,430 | 8/1994 | Parsonage et al. | 204/412 |
| 5,352,651 | 10/1994 | Debe et al. | 503/227 |

(List continued on next page.)

FOREIGN PATENT DOCUMENTS

| | | |
|---|---|---|
| 1299936 | 5/1992 | Canada . |
| 0 094 679 A2 | 5/1983 | European Pat. Off. . |
| 0 116 383 | 8/1984 | European Pat. Off. . |
| 0 309 259 A2 | 9/1988 | European Pat. Off. . |
| 0 640 382 | 3/1995 | European Pat. Off. . |
| 51-46589 | 4/1976 | Japan . |
| 57-060670 | 4/1982 | Japan . |
| 60-825 | 1/1985 | Japan . |
| 63-117321 Hei-Sei | 5/1988 | Japan . |
| 6-68157 | 8/1994 | Japan . |
| 1100497 | 1/1968 | United Kingdom . |
| 1 547 534 | 6/1979 | United Kingdom . |
| WO 95/06002 | 2/1995 | WIPO . |
| WO 97/25369 | 7/1997 | WIPO . |

OTHER PUBLICATIONS

M. Uchida, Y. Aoyama, N. Eda, A. Ohta, J. Electrochem. Soc., *New Preparation Method for Polymer–Electrolyte Fuel Cells,* vol. 142, No. 2, Feb. 1995.

D. D. DesMarteau, *Novel Fluorinated Acids for Phosphoric Acid Fuel Cells,* Final Report, Dept. of Chemistry, Clemson University, Clemson, S.C., 1992.

Darryl D. DesMarteau, *Novel perfluorinated ionomers and ionenes,* Journal of Fluorine Chemistry, 72 (1995) pp. 203–208.

Proceedings from DARPA's Direct Methanol Fuel Cell Program Review, System Planning Corporation, USA Today Bldg., Arlington, VA., Nov. 14–15, 1996, pp. 14–18.

K. Robbie, L.J. Friedrich, S.K. Dew, T. Smy, M.J. Brett, *Fabrication of thin films with highly porous microstructures,* J. Vac. Sci. Technol. A, vol. 13, No. 3, May/Jun. 1995, pp. 1032–1035.

(List continued on next page.)

*Primary Examiner*—Bruce F. Bell
*Attorney, Agent, or Firm*—Philip Y. Dahl

[57] ABSTRACT

Nanostructured elements are provided for use in the electrode of a membrane electrode assembly for use in fuel cells, sensors, electrochemical cells, and the like. The nanostructured elements comprise acicular microstructured support whiskers bearing acicular nanoscopic catalyst particles which may comprise alternating layers of catalyst materials, which may comprise a surface layer that differs in composition from the bulk composition of the catalyst particles, and which may demonstrate improved carbon monoxide tolerance.

20 Claims, 6 Drawing Sheets

U.S. PATENT DOCUMENTS

| | | | |
|---|---|---|---|
| 5,384,208 | 1/1995 | Brand et al. | 429/34 |
| 5,387,462 | 2/1995 | Debe | 428/245 |
| 5,395,705 | 3/1995 | Door et al. | 429/42 |
| 5,399,184 | 3/1995 | Harada | 29/623.4 |
| 5,418,007 | 5/1995 | Debe | 427/154 |
| 5,429,886 | 7/1995 | Struthers | 429/44 |
| 5,459,016 | 10/1995 | Debe et al. | 430/201 |
| 5,459,026 | 10/1995 | Debe et al. | 430/201 |
| 5,460,896 | 10/1995 | Takada et al. | 429/33 |
| 5,472,799 | 12/1995 | Watanabe | 429/30 |
| 5,514,461 | 5/1996 | Meguro et al. | 428/310.5 |
| 5,523,177 | 6/1996 | Kosek et al. | 429/40 |
| 5,547,551 | 8/1996 | Bahar et al. | 204/296 |
| 5,599,614 | 2/1997 | Bahar et al. | 442/171 |
| 5,614,306 | 3/1997 | Jobe et al. | 442/381 |
| 5,620,807 | 4/1997 | Mussell et al. | 429/33 |
| 5,626,805 | 5/1997 | Meguro et al. | 264/41 |
| 5,635,039 | 6/1997 | Cisar et al. | 204/252 |
| 5,635,041 | 6/1997 | Bahar et al. | 204/282 |
| 5,641,565 | 6/1997 | Sogo | 428/315.7 |
| 5,646,929 | 7/1997 | Debe | 428/323 |
| 5,659,296 | 8/1997 | Debe et al. | 240/632 |
| 5,702,755 | 12/1997 | Mussell | 427/115 |
| 5,702,839 | 12/1997 | Frost et al. | 429/42 |

OTHER PUBLICATIONS

Kevin Robbie, Michael J. Brett, Akhlesh Lakhtakia, *First thin film realization of a helicoidal bianisotropic medium*, J. Vac. Sci. Technol. A 13(6), Nov./Dec. 1995 pp. 2991–2993.

Kenneth G. Kreider, Michael J. Tarlov, James P. Cline, *Sputtered thin–film pH electrodes of platinum, palladium, ruthenium, and iridium oxides,* Sensprs amd Actiatprs B 29 (1995) pp. 167–172.

E–TEK, Inc., Gas Diffusion Electrodes and Catalyst Materials, C. Noble Metal Catalysts on Carbon, 1995 Catalogue, pp. 15–21.

M. Razaq, A. Razaaq, E. Yeager, Darryl D. DesMarteau, S. Singh, *Perfluorosulfonimide as an Additive in Phosphoric Acid Fuel Cell,* J. Electrochem. Soc., vol. 136, No. 2, Feb. 1989, pp. 385–390.

M. Razaq, A. Razaaq, E. Yeager, Darryl D. DesMarteau, S. Singh, *Oxygen electroreduction in perfluorinated sulphonyl imides,* Journal of Applied Electrochemistry 17 (1987) pp. 1057–1064.

Minoru Mizuhata, Kazuaki Yasuda, Keisuke Oguro, Hiroyasu Takenaka, *Preparation of Gas Diffusion Electrode with Highly–active Catalyst for PEFCs,* Electrochemical Society Proceedings vol. 95–23, pp. 24–33.

Acc. No. 96–005215/01 (Abstract from Derwent Database) No month/year available.

Acc. No. 88–311503/44 (Abstract from Derwent Database) No month/year available.

Acc. No. 88–144518/21 (Abstract from Derwent Database) No month/year available.

Acc. No. 95–218572/29 (Abstract from Derwent Database) No month/year available.

Acc. No. 88–317781/45 (Abstract from Derwent Database) No month/year available.

Acc. No. 95–188591/25 (Abstract from Derwent Database) No month/year available.

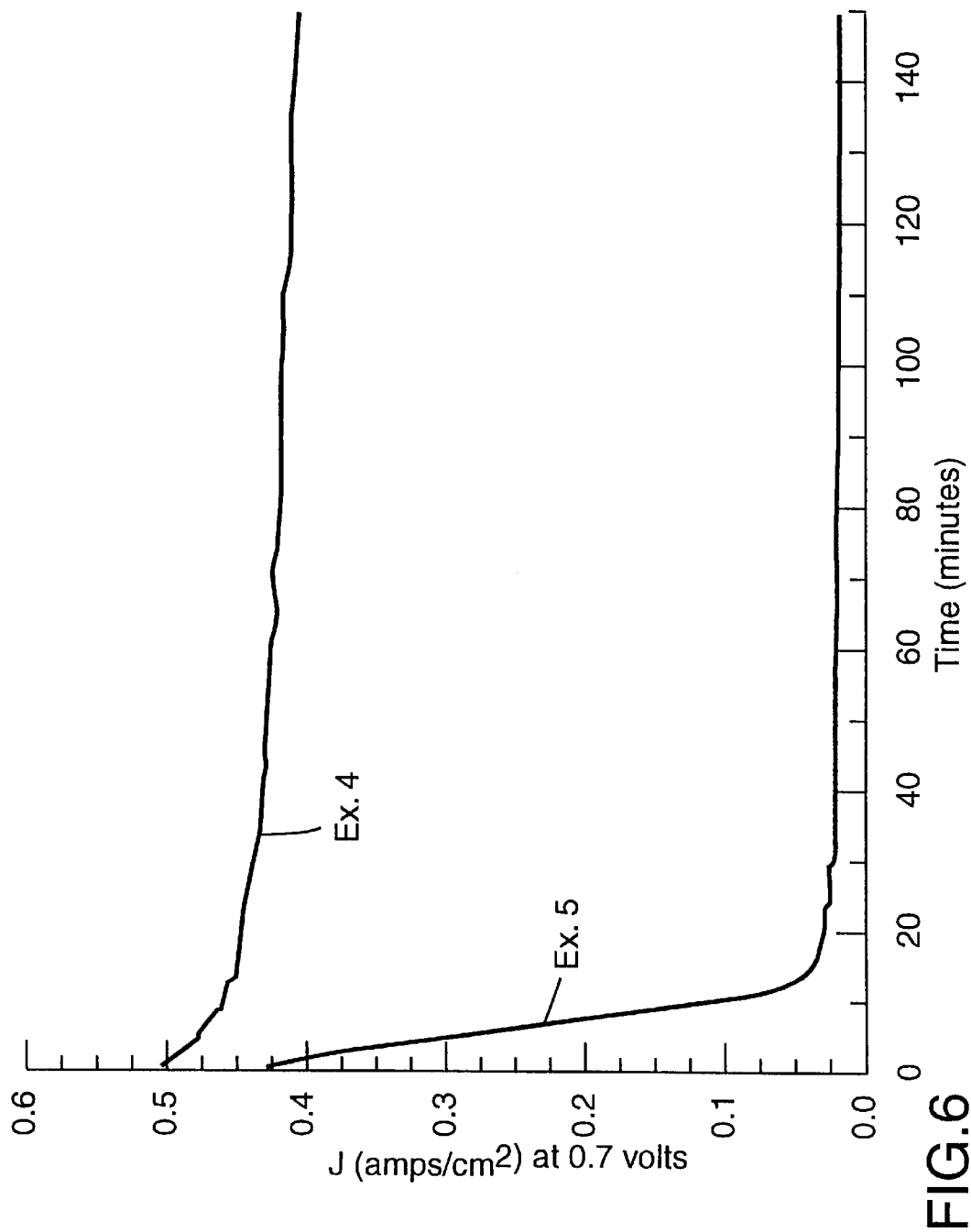

CATALYST FOR MEMBRANE ELECTRODE ASSEMBLY AND METHOD OF MAKING

FIELD OF THE INVENTION

This invention relates to nanostructured catalysts for use in fuel cells and sensors and particularly to catalysts exhibiting excellent resistance to carbon monoxide poisoning. The invention further relates to a method of making the catalyst and to fuel cells and sensors in which the catalyst is used.

BACKGROUND OF THE INVENTION

Electrochemical cells, including proton exchange membrane fuel cells, sensors, electrolyzers, and electrochemical reactors, are known in the art. Typically, the central component of such a cell is a membrane electrode assembly, comprising two catalyzing electrodes separated by an ion-conducting membrane (ICM), often referred to as a Membrane Electrode Assembly (MEA). In a fuel cell, the MEA is sandwiched between two porous, electrically-conductive backing layers to form a 5-layer assembly. When the 3-layer MEA comprises a central polymeric membrane, the fuel cell is often referred to as a polymer electrolyte fuel cell (PEFC). In a typical low-temperature fuel cell, hydrogen gas is oxidized at the anode and oxygen gas (usually as air) is reduced at the cathode:

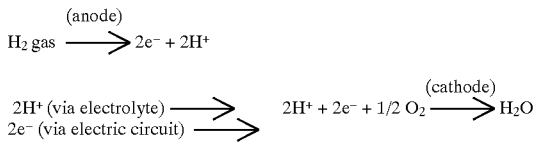

Fuel cell MEAs have been constructed using catalyst electrodes in the form of applied dispersions of either Pt fines or carbon supported Pt catalysts. These conventional catalysts are applied in an ink or paste containing electrolyte to either the ICM or to a backing layer placed adjacent to the membrane. The predominant catalyst form used for hydrogen-fuel polymer electrolyte membranes is Pt or Pt alloys coated onto larger carbon particles by wet chemical methods, such as the reduction of chloroplatinic acid. This conventional form of catalyst is dispersed with ionomeric binders, solvents and often polytetrafluoroethylene (PTFE) particles, to form an ink, paste or dispersion that is applied to either the membrane, or the electrode backing material. In addition to mechanical support, it is generally believed in the art that the carbon support particles provide necessary electrical conductivity within the electrode layer.

In another variation, a catalyst metal salt is reduced in an organic solution of a solid polymer electrolyte to form a distribution of catalyst metal particles in the electrolyte, without a support particle, which is then cast onto an electrode backing layer to form the catalyst electrode.

In a further variation, Pt fines are mixed directly with a solution of solvents and polymer electrolyte and coated onto the electrode backing layer. However, because of limitations on how small the fines can be made and the stability of the dispersion, this approach results in very high, and therefore expensive, loading of the catalyst.

Conventional catalyst alloy particles are typically prepared by wet chemical or metallurgical methods and supported on conventional carbon support particles. Conventional particles have a homogeneous composition representative of the alloy stoichiometry, a generally spherical morphology indicative of the crystallite growth habit of particles produced by conventional methods, and are randomly distributed over the surface of a larger support particle. The catalyst particles may also be used without a support as a "black". Such particles are reported to be in the 2 to 25 nm size range and they increase in diameter as the amount of catalyst per support particle increases.

Various other structures and means have been used to apply or otherwise bring a catalyst in contact with an electrolyte to form electrodes. These MEAs can include: (a) porous metal films or planar distributions of metal particles or carbon supported catalyst powders deposited on the surface of the ICM; (b) metal grids or meshes deposited on or imbedded in the ICM; or (c) catalytically active nanostructured composite elements embedded in the surface of the ICM.

PEFCs are seen as a potential energy source for, e.g., electric vehicles, since PEFCs have been shown to exhibit high energy conversion efficiency, high power density and negligible pollution. In a vehicle such as an automobile, one convenient source of hydrogen gas can be the steam reformation of methanol, since methanol can be stored more easily in a vehicle than hydrogen. However, it is known that methanol reformate gas can contain as much as 25% carbon dioxide ($CO_2$) and up to 1% carbon monoxide (CO), and that the catalytic performance of pure platinum can be significantly reduced by the presence of even 10 parts per million (ppm) of CO. Therefore, successful use of reformed hydrogen fuel depends upon either decreasing the CO content of the fuel or development of CO-tolerant catalysts, or both.

Two methods have been reported in the art to avoid the effects of CO on PEFC performance. The first method is by oxidation of CO to $CO_2$ at the anode by means of introducing air, typically 2% by volume, into the reformate hydrogen stream, as described in U.S. Pat. No. 4,910,099. While this method is effective, it introduces added complexity to the PEFC and a loss of efficiency. The second method is to enhance the CO tolerance of Pt electrodes by alloying it with a second element, preferably ruthenium (Ru) (see, for example, M. Iwase and S. Kawatsu, *Electrochemical Society Proceedings*, V. 95-23, p. 12; *Proceedings of the First International Symposium on Proton Conducting Membrane Fuel Cells*, S. Gottesfeld, et al., Eds., The Electrochemical Society, Pennington, N.J., 1995). Tolerance for as much as 100 ppm CO was achieved for a 1:1 atomic ratio alloy of Pt:Ru on a carbon support at Pt loading level of 0.4 mg/cm$^2$, the fuel cell operating at 80° C. It is further known in the art (T. A. Zawodzinski, Jr., presented at *Fuel Cells for Transportation*, U.S. Department of Energy, National Laboratory R&D Meeting, Jul. 22–23, 1997, Washington, D.C.) that a PEFC having a PtRu mass loading of 0.6 mg/cm$^2$ operating at temperatures above 100° C. has been shown to be tolerant to 100 ppm CO. However, this method loses effectiveness at lower temperature operation or when lower loading of the catalyst is used.

Nanostructured composite articles have been disclosed. See, for example, U.S. Pat. Nos. 4,812,352, 5,039,561, 5,176,786, 5,336,558, 5,338,430, and 5,238,729. U.S. Pat. No. 5,338,430 discloses that nanostructured electrodes embedded in solid polymer electrolyte offer superior properties over conventional electrodes employing metal fines or carbon-supported metal catalysts, including: more efficient use of costly catalyst material and enhanced catalytic activity.

SUMMARY OF THE INVENTION

Briefly, this invention provides a nanostructured element comprising an acicular microscopic support whisker bearing acicular nanoscopic catalyst particles for use in electrochemical cells and a process and apparatus for preparing such elements. The catalyst of this invention demonstrates improved performance in PEFC anode catalysts for oxidation of hydrogen in the presence of carbon monoxide. The catalysts of this invention can be used in MEAs in fuel cells, sensors, electrolysers, chlor-alkali separators, and the like.

In another aspect, there is provided a method of making the nanostructured element of the invention. The catalyst articles of the present invention are made by vacuum coating of catalyst onto microstructures in layers so that the catalyst forms acicular nanoscopic catalyst particles supported on the microstructures. This structure provides an extremely high surface area/volume ratio for the catalyst material. At the same time, this process allows unprecedented control over the catalyst composition and morphology. For example, alternating layers of differing catalyst materials may be deposited. The degree of crystallinity and alloying may be controlled. Furthermore, the final surface composition can be adjusted independently of the bulk composition of the catalyst.

In another aspect, there is provided a catalyst demonstrating improved carbon monoxide tolerance in fuel cell use.

In a further aspect, there are provided electrochemical devices, including fuel cells, which incorporate the nanostructured elements of the invention.

In this application:

"membrane electrode assembly" means a structure comprising a membrane that includes an electrolyte and at least one but preferably two or more electrodes adjoining the membrane;

"growth surface" means, with regard to a nanoscopic catalyst particle, the portion of the surface on which deposited material is preferentially incorporated;

"nanostructured element" means an acicular, discrete, microscopic structure comprising a catalytic material on at least a portion of its surface;

"microstructure" means an acicular, discrete, microscopic structure;

"nanoscopic catalyst particle" means a particle of catalyst material having at least one dimension equal to or smaller than about 10 nm or having a crystallite size of about 10 nm or less, as measured from diffraction peak half widths of standard 2-theta x-ray diffraction scans;

"acicular" means having a ratio of length to average cross-sectional width of greater than or equal to 3;

"discrete" refers to distinct elements, having a separate identity, but does not preclude elements from being in contact with one another; and "microscopic" means having at least one dimension equal to or smaller than about a micrometer.

It is an advantage of the present invention to provide a catalyst in the form of a nanostructure element with very high surface area/volume ratio, controllable composition and morphology, and superior CO tolerance.

BRIEF DESCRIPTION OF THE DRAWINGS

FIG. 6 is a graph showing current density over time for a fuel cells of the present invention and a comparative fuel cell.

DETAILED DESCRIPTION OF PREFERRED EMBODIMENTS

Catalyst particles of the present invention comprise elongated or acicular nanoscopic particles having one dimension equal to or smaller than about 10 nm. The catalyst particles are formed by vacuum deposition of catalyst materials on to acicular microstructured supports having one dimension equal to or smaller than about 1 micrometer. During the deposition process of the invention, the catalyst particles predominantly increase in length rather than diameter as the amount of catalyst per support particle increases. The catalyst particles of the present invention may have alternating layers of different catalyst materials which may differ in composition, in degree of alloying or in degree of crystallinity. By varying the thicknesses of the individual layers the stoichiometry of the bulk and the degree of alloying can be changed. By controlling which deposition sources are on or off and how much power is provided to the deposition sources during the final passes of the substrate in front of the sources, the surface composition can be controlled. The surface composition of the catalyst particle can have a different composition than the bulk composition of the particle.

Figure 1:
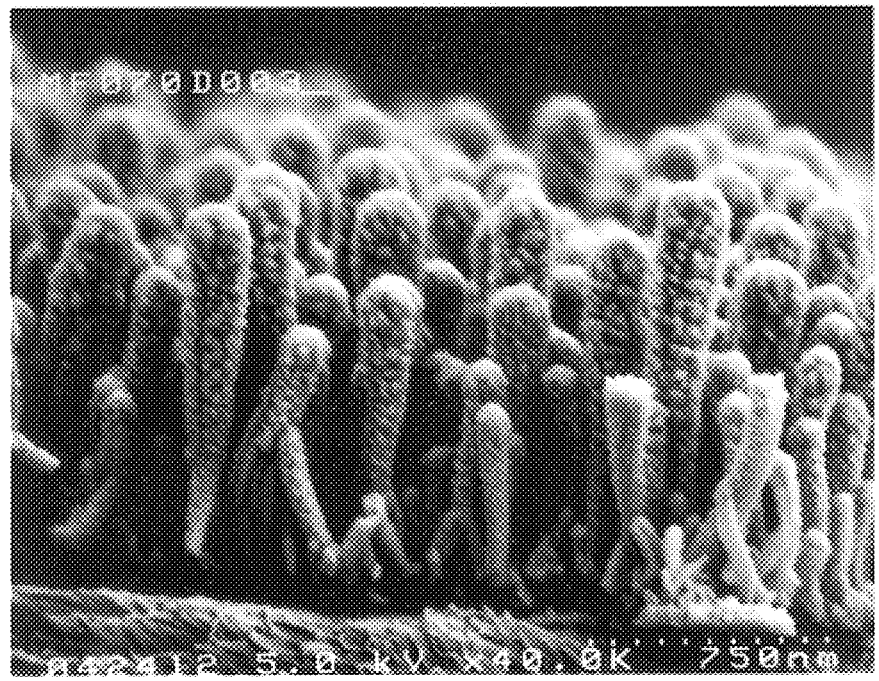
FIG. 1 is a field emission scanning electron micrograph taken at 40,000× magnification of the nanostructured elements of the present invention on their initial substrate.
Figure 2:
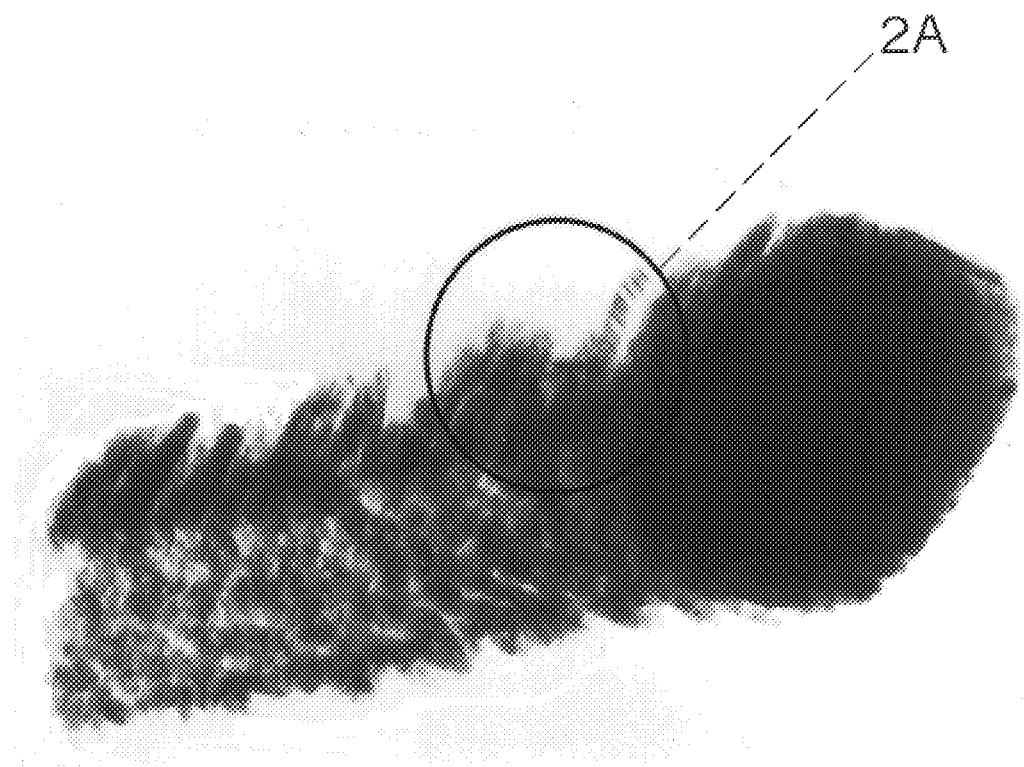
FIG. 2 is a transmission electron micrograph taken at 270,000× magnification of a single acicular support particle coated with acicular nanoscopic catalyst particles according to the present invention.
Figure 3:
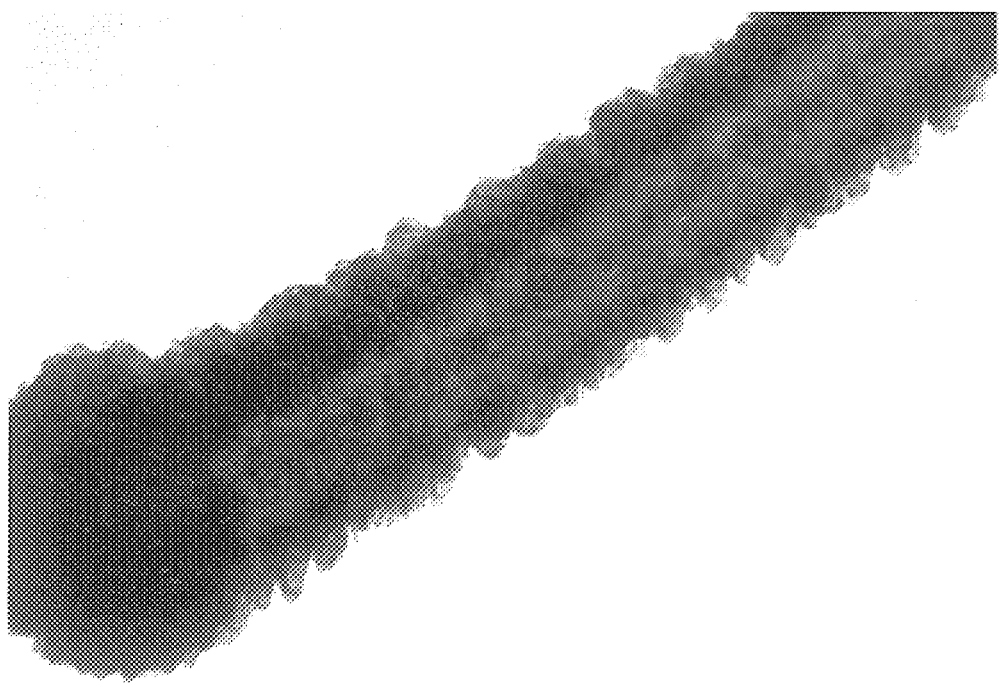
FIG. 3 is a transmission electron micrograph taken at 270,000× magnification of a single acicular support particle coated with acicular nanoscopic catalyst particles according to the present invention.

The nanoscopic catalyst particles of the present invention are visible in FIG. 1, a field emission scanning electron micrograph of the nanostructured elements of the present invention still on the initial substrate, before transfer to an ICM, and in FIGS. 2 and 3, both transmission electron micrographs of single acicular support particles coated with acicular nanoscopic catalyst particles.

Figure 2A:
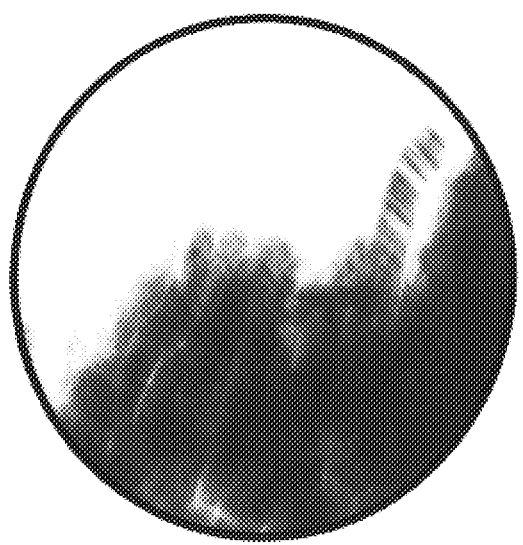
FIG. 2A is detail of FIG. 2.

FIG. 2 is a transmission electron microscope image of a portion of a single catalyst-coated support particle of the instant invention. The acicular support particle is a perylene red (PR149) crystalline whisker and the catalyst loading was 0.42 mg/cm$^2$ of alternating layers of Pt and Ru. FIG. 2 demonstrates that the binary catalyst coating comprises even smaller, closely packed but discrete acicular shaped particles uniformly oriented slightly off-normal to the sides of the PR149 core. The nanoscopic acicular catalyst particles are only about 8–9 nm in diameter and, for this example about 50 nm long. For example, the acicular nanoscopic particle highlighted in the inset (FIG. 2A) is 55 nm long and 9.3 nm in diameter. For lower or higher catalyst loadings on the electrodes, the length of the catalyst particle is shorter or longer than this example, since the acicular particles grow longer as more material is added.

This same type of columnar or acicular growth morphology of the catalyst particles on the sides of the support particles is seen for both crystalline and amorphous catalyst particles alike. FIG. 3 shows such nodular growth of amorphous PtO$_x$ coated onto a PR149 support particle. In this example, the catalyst particles have a fairly low aspect ratio because the catalyst loading is fairly low. With increased loading, the acicular catalyst particles become longer.

FIG. 2 also demonstrates that the individual acicular catalyst particles are crystalline and layered. The electron micrograph shows interference bands in the TEM image of some of the crystallites due to stacking faults. These appear as bands of light and dark perpendicular to the length of the catalyst particle. This is direct evidence that the individual acicular catalyst particles contain crystalline material. X-ray diffraction theta-two theta scans from these catalysts show that the PtRu is a mixed alloy with a Pt type of face centered cubic crystal lattice (FCC). For an FCC lattice, only the close-packed (111) lattice planes can show stacking faults, indicating the catalyst particle exhibiting the bands contains crystallites with a [111] growth axis. (FIG. 2 shows only a few catalyst particles demonstrating interference bands, due to the conditions necessary for the appearance of electron interference, including the proper location and orientation of the object. However, all the nanoscopic catalyst particles are expected to have the same crystalline structure.)

While not bound by theory, some conclusions can be drawn concerning the alloy make-up of the acicular catalyst particle. The conditions used to prepare the sample shown in FIG. 2 were the same as described in Ex. 6 cases 3–5, except the duration of sputtering was 50 minutes, giving a total mass loading of 0.43 mg/cm$^2$. Ex. 6 shows that these binary catalysts are Ru rich (Pt:Ru=35:65 wt %) and that X-ray diffraction theta-two theta scans from these series of samples show two crystalline phases are obtained, one a crystalline alloy having a Pt face centered cubic lattice structure and a stoichiometry of PtRu$_2$, and the second a Ru crystal phase. It is likely that the stacking faults illustrated in the acicular crystalline particles of FIG. 2 are associated with the interfaces between the alternating PtRu$_2$ crystal phases and the Ru phases. In other words, during deposition growth of the crystallite particle, the Ru rich catalyst phase separates into alternating layers of PtRu$_2$ alloy and pure Ru. At the drum rotation speeds and deposition rates used in the sample of FIG. 2, approximately a mass equivalent of 290 nm of PtRu is added to the surface for the 73 drum revolutions in the 50 minute coating duration. This implies approximately 4 nm/rev of material is added to the surface. Assuming it is concentrated onto the ends of the acicular crystallites, this layer thickness is of the same order as the d(111) lattice spacing obtained from the X-ray diffraction peak fitting discussed in Ex. 6.

Microstructured supports suitable for use in the present invention may comprise whiskers of organic pigment, most preferably C.I. PIGMENT RED 149 (perylene red). The crystalline whiskers have substantially uniform but not identical cross-sections, and high length-to-width ratios. The microstructured support whiskers are coated with coating materials suitable for catalysis, and which endow the whiskers with a fine nanoscopic surface structure capable of acting as multiple catalytic sites.

Methods for making microstructured layers are known in the art. For example, methods for making organic microstructured layers are disclosed in *Materials Science and Engineering*, A158 (1992), pp. 1–6; *J. Vac. Sci. Technol. A*, 5, (4), July/August, 1987, pp. 1914–16; *J. Vac. Sci. Technol. A*, 6, (3), May/August, 1988, pp. 1907–11; *Thin Solid Films*, 186, 1990, pp. 327–47; *J. Mat. Sci.*, 25, 1990, pp. 5257–68; *Rapidly Quenched Metals*, Proc. of the Fifth Int. Conf. on Rapidly Quenched Metals, Wurzburg, Germany (Sep. 3–7, 1984), S. Steeb et al., eds., Elsevier Science Publishers B.V., New York, (1985), pp. 1117–24; *Photo. Sci. and Eng.*, 24, (4), July/August, 1980, pp. 211–16; and U.S. Pat. Nos. 4,568,598 and 4,340,276, the disclosures of which patents are incorporated herein by reference. Methods for making inorganic-based microstructured layers of whiskers are disclosed, for example, in *J. Vac. Sci. Tech. A*, 1, (3), July/September, 1983, pp. 1398–1402 and U.S. Pat. No. 3,969,545; U.S. Pat. Nos. 4,252,865, 4,396,643, 4,148,294, 4,252,843, 4,155,781, 4,209,008, and 5,138,220, the disclosures of which patents are incorporated herein by reference. K. Robbie, L. J. Friedrich, S. K. Dew, J. Smy and M. J. Brett, *J. Vac. Sci. Technol.* A 13(3), 1032 (1995) and K. Robbie, M. J. Brett and A. Lakhtokia, *J. Vac. Sci. Technol.* A 13(6), 2991(1995).

Orientation of the microstructures is generally uniform in relation to the surface of the substrate. The microstructures are usually oriented normal to the original substrate surface, the surface normal direction being defined as that direction of the line perpendicular to an imaginary plane lying tangent to the local substrate surface at the point of contact of the base of the microstructure with the substrate surface. The surface normal direction is seen to follow the contours of the surface of the substrate. The major axes of the microstructures can be parallel or nonparallel to each other.

Alternatively, the microstructures can be nonuniform in shape, size, and orientation. For example, the tops of the microstructures can be bent, curled, or curved, or the microstructures can be bent, curled, or curved over their entire length.

Preferably, the microstructures are of uniform length and shape, and have uniform cross-sectional dimensions along their major axes. The preferred length of each microstructure is less than about 50 micrometers. More preferably, the length of each microstructure is in the range from about 0.1 to 5 micrometers, most preferably 0.1 to 3 micrometers. Within any microstructured layer it is preferable that the microstructures be of uniform length. Preferably, the average cross-sectional dimension of each microstructure is less than about 1 micrometer, more preferably 0.01 to 0.5 micrometer. Most preferably, the average cross-sectional dimension of each microstructure is in the range from 0.03 to 0.3 micrometer.

Preferably, the microstructures have an areal number density in the range from about 10$^7$ to about 10$^{11}$ microstructures per square centimeter. More preferably, the microstructures have an areal density in the range from about 10$^8$ to about 10$^{10}$ microstructures per square centimeter.

Microstructures can have a variety of orientations and straight and curved shapes, (e.g., whiskers, rods, cones, pyramids, spheres, cylinders, laths, and the like that can be twisted, curved, or straight), and any one layer can comprise a combination of orientations and shapes.

The microstructures have an aspect ratio (i.e., a length to diameter ratio) preferably in the range from about 3:1 to about 100:1.

Materials useful as a substrate include those which maintain their integrity at the conditions used to form the microstructure. The substrate can be flexible or rigid, planar or non-planar, convex, concave, textured, or combinations thereof.

Preferred substrate materials include organic materials and inorganic materials (including, for example, glasses, ceramics, metals, and semiconductors). Preferred inorganic substrate materials are glass or metal. A preferred organic substrate material is a polyimide. More preferably, the substrate is metallized with a 10–70 nm thick layer of an electrically conductive metal for removal of static charge. The layer may be discontinuous. Preferably the layer is the same metal used to coat the microstructure whiskers.

Representative organic substrates include those that are stable at the annealing temperature, for example, polymers such as polyimide film (commercially available, for example, under the trade designation "KAPTON" from DuPont Electronics, Wilmington, Del.), high temperature stable polyimides, polyesters, polyamids, and polyaramids.

Metals useful as substrates include, for example, aluminum, cobalt, copper, molybdenum, nickel, platinum, tantalum, or combinations thereof. Ceramics useful as a substrate material include, for example, metal or non-metal oxides such as alumina and silica. A useful inorganic non-metal is silicon.

The organic material from which the microstructures can be formed may be coated onto the substrate using techniques known in the art for applying a layer of an organic material onto a substrate, including, for example, vapor phase deposition (e.g., vacuum evaporation, sublimation, and chemical vapor deposition), and solution coating or dispersion coating (e.g., dip coating, spray coating, spin coating, blade or knife coating, bar coating, roll coating, and pour coating (i.e., pouring a liquid onto a surface and allowing the liquid to flow over the surface)). Preferably, the organic layer is applied by physical vacuum vapor deposition (i.e., sublimation of the organic material under an applied vacuum).

Useful organic materials for producing microstructures by, for example, coating followed by plasma etching, can include for example, polymers and prepolymers thereof (e.g., thermoplastic polymers such as, for example, alkyds, melamines, urea formaldehydes, diallyl phthalates, epoxies, phenolics, polyesters, and silicones; thermoset polymers, such as acrylonitrile-butadiene-styrenes, acetals, acrylics, cellulosics, chlorinated polyethers, ethylene-vinyl acetates, fluorocarbons, ionomers, nylons, parylenes, phenoxies, polyallomers, polyethylenes, polypropylenes, polyamide-imides, polyimides, polycarbonates, polyesters, polyphenylene oxides, polystyrenes, polysulfones, and vinyls); and organometallics (e.g., bis($\eta^5$-cyclopentadienyl)iron (II), iron pentacarbonyl, ruthenium pentacarbonyl, osmium pentacarbonyl, chromium hexacarbonyl, molybdenum hexacarbonyl, tungsten hexacarbonyl, and tris (triphenylphosphine) rhodium chloride).

Preferably, the chemical composition of the organic-based microstructured layer will be the same as that of the starting organic material. Preferred organic materials useful in preparing the microstructured layer include, for example, planar molecules comprising chains or rings over which π-electron density is extensively delocalized. These organic materials generally crystallize in a herringbone configuration. Preferred organic materials can be broadly classified as polynuclear aromatic hydrocarbons and heterocyclic aromatic compounds.

Polynuclear aromatic hydrocarbons are described in Morrison and Boyd, *Organic Chemistry*, Third Edition, Allyn and Bacon, Inc. (Boston: 1974), Chapter 30. Heterocyclic aromatic compounds are described in Morrison and Boyd, supra, Chapter 31.

Preferred polynuclear aromatic hydrocarbons, which are commercially available, include, for example, naphthalenes, phenanthrenes, perylenes, anthracenes, coronenes, and pyrenes. A preferred polynuclear aromatic hydrocarbon is N,N'-di(3,5-xylyl)perylene-3,4,9,10 bis(dicarboximide) (commercially available under the trade designation "C. I. PIGMENT RED 149" from American Hoechst Corp. of Somerset, N.J.), herein designated "perylene red."

Preferred heterocyclic aromatic compounds, which are commercially available, include, for example, phthalocyanines, porphyrins, carbazoles, purines, and pterins. Representative examples of heterocyclic aromatic compounds include, for example, metal-free phthalocyanine (e.g., dihydrogen phthalocyanine) and its metal complexes (e.g. copper phthalocyanine).

The organic materials preferably are capable of forming a continuous layer when deposited onto a substrate. Preferably, the thickness of this continuous layer is in the range from 1 nanometer to about one thousand nanometers.

Orientation of the microstructures can be affected by the substrate temperature, the deposition rate, and angle of incidence during deposition of the organic layer. If the temperature of the substrate during deposition of the organic material is sufficiently high (i.e., above a critical substrate temperature which has been associated in the art with a value one-third the boiling point, in degrees Kelvin, of the organic material), the deposited organic material will form randomly oriented microstructures either as deposited or when subsequently annealed. If the temperature of the substrate during deposition is relatively low (i.e., below the critical substrate temperature), the deposited organic material tends to form uniformly oriented microstructures when annealed. For example, if uniformly oriented microstructures comprising perylene red are desired, the temperature of the substrate during the deposition of the perylene red is preferably about 0° to about 30° C. Certain subsequent coating processes, such as DC magnetron sputtering and cathodic arc vacuum processes, can produce curvilinear microstructures. If a patterned distribution of microstructures is desired, microstructures may be selectively removed from the substrate, for example, by mechanical means, vacuum process means, chemical means, gas pressure or fluid means, radiation means, and combinations thereof. Useful mechanical means include, for example, scraping microstructures off the substrate with a sharp instrument (e.g., with a razor blade), and encapsulating with a polymer followed by delamination. Useful radiation means include laser or light ablation. Such ablation can result in a patterned electrode. Useful chemical means include, for example, acid etching selected areas or regions of the microstructured layer. Useful vacuum means include, for example, ion sputtering and reactive ion etching. Useful air pressure means include, for example, blowing the microstructures off the substrate with a gas (e.g., air) or fluid stream. Combinations of the above are also possible, such as use of photoresists and photolithography.

The microstructures can be extensions of the substrate and of the same material as the substrate by, e.g., vapor depositing a discontinuous metal microisland mask onto the surface of a polymer, then plasma or reactive ion etching away the polymer material not masked by the metal microislands, to leave polymer substrate posts protruding from the surface, so long as they are transferable to the ICM.

A preferred method for making an organic-based microstructured layer is disclosed in U.S. Pat. Nos. 4,812,352 and 5,039,561, the disclosures of which are incorporated herein by reference. As disclosed therein, a method for making a microstructured layer comprises the steps of i) depositing or condensing a vapor of an organic material as a thin, continuous or discontinuous layer onto a substrate; and ii) annealing the deposited organic layer in a vacuum for a time and at a temperature sufficient to induce a physical change in the deposited organic layer to form a microstructured layer comprising a dense array of discrete microstructures but insufficient to cause the organic layer to evaporate or sublimate.

There can be an optimum maximum annealing temperature for different film thicknesses in order to fully convert the deposited layer to microstructures. When fully converted, the major dimension of each microstructure is directly proportional to the thickness of the initially deposited organic layer. Since the microstructures are discrete, are separated by distances on the order of their cross-sectional dimensions, and preferably have uniform cross-sectional dimensions, and all the original organic film material is converted to microstructures, conservation of mass implies that the lengths of the microstructures will be proportional to the thickness of the layer initially deposited. Due to this relationship of the original organic layer thickness to the lengths of the microstructures, and the independence of cross-sectional dimensions from length, the lengths and aspect ratios of the microstructures can be varied independently of their cross-sectional dimensions and areal densities. For example, it has been found that the length of microstructures are approximately 10–15 times the thickness of the vapor deposited perylene red layer, when the thickness ranges from about 0.05 to about 0.2 micrometer. The surface area of the microstructured layer (i.e., the sum of the surface areas of the individual microstructures) is much greater than that of the organic layer initially deposited on the substrate. Preferably, thickness of the initially deposited layer is in the range from about 0.03 to about 0.5 micrometer.

Each individual microstructure can be monocrystalline or polycrystalline, rather than amorphous. The microstructured layer can have highly anisotropic properties due to the crystalline nature and uniform orientation of the microstructures.

If a discontinuous distribution of microstructures is desired, masks may be used in the organic layer deposition step to selectively coat specific areas or regions of the substrate. Other techniques known in the art for selectively depositing an organic layer on specific areas or regions of a substrate may also be useful.

In the annealing step, the substrate having an organic layer coated thereon is heated in a vacuum for a time and at a temperature sufficient for the coated organic layer to undergo a physical change, wherein the organic layer grows to form a microstructured layer comprising a dense array of discrete, oriented monocrystalline or polycrystalline microstructures. Uniform orientation of the microstructures is an inherent consequence of the annealing process when the substrate temperature during deposition is sufficiently low. Exposure of the coated substrate to the atmosphere prior to the annealing step is not observed to be detrimental to subsequent microstructure formation.

If, for example, the coated organic material is perylene red or copper phthalocyanine, annealing is preferably done in a vacuum (i.e., less than about $1 \times 10^{-3}$ Torr) at a temperature in the range from about 160° to about 270° C. The annealing time necessary to convert the original organic layer to the microstructured layer is dependent on the annealing temperature. Typically, an annealing time in the range from about 10 minutes to about 6 hours is sufficient. Preferably the annealing time is in the range from about 20 minutes to about 4 hours. Further, for perylene red, the optimum annealing temperature to convert all of the original organic layer to a microstructured layer, but not sublime it away, is observed to vary with the deposited layer thickness. Typically, for original organic layer thicknesses of 0.05 to 0.15 micrometer, the temperature is in the range of 245° to 270° C.

The time interval between the vapor deposition step and the annealing step can vary from several minutes to several months, with no significant adverse effect, provided the coated composite is stored in a covered container to minimize contamination (e.g., dust). As the microstructures grow, the organic infrared band intensities change and the laser specular reflectivity drops, allowing the conversion to be carefully monitored, for example, in situ by surface infrared spectroscopy. After the microstructures have grown to the desired dimensions, the resulting layered structure, which comprises the substrate and the microstructures, is allowed to cool before being brought to atmospheric pressure.

Useful inorganic materials for producing microstructures include, for example, carbon, diamond-like carbon, ceramics (e.g., metal or non-metal oxides such as alumina, silica, iron oxide, and copper oxide; metal or non-metal nitrides such as silicon nitride and titanium nitride; and metal or non-metal carbides such as silicon carbide; metal or non-metal borides such as titanium boride); metal or non-metal sulfides such as cadmium sulfide and zinc sulfide; metal silicides such as magnesium silicide, calcium silicide, and iron silicide; metals (e.g., noble metals such as gold, silver, platinum, osmium, iridium, palladium, ruthenium, rhodium, and combinations thereof; transition metals such as scandium, vanadium, chromium, manganese, cobalt, nickel, copper, zirconium, and combinations thereof; low melting metals such as bismuth, lead, indium, antimony, tin, zinc, and aluminum; refractory metals such as tungsten, rhenium, tantalum, molybdenum, and combinations thereof); and semiconductor materials (e.g., diamond, germanium, selenium, arsenic, silicon, tellurium, gallium arsenide, gallium antimonide, gallium phosphide, aluminum antimonide, indium antimonide, indium tin oxide, zinc antimonide, indium phosphide, aluminum gallium arsenide, zinc telluride, and combinations thereof).

The microstructures of the preferred embodiment can be made to have random orientations by control of the substrate temperature during the deposition of the initial PR149 layer, as described above. They can also be made to have curvilinear shapes by conditions of the coating process. As discussed in FIG. 6 of L. Aleksandrov, "GROWTH OF CRYSTALLINE SEMICONDUCTOR MATERIALS ON CRYSTAL SURFACES," Chapter 1, Elsevier, New York, 1984, the energies of the arriving atoms applied by different coating methods, e.g., thermal evaporation deposition, ion deposition, sputtering and implantation, can range over 5 orders of magnitude.

It is within the scope of the present invention to modify the methods for making a microstructured layer to make a discontinuous distribution of microstructures.

The coating material, which comprises the nanoscopic catalyst particles, is preferably a catalytic material or material that contributes to the catalytic properties of the nanostructured element as a whole. The coating material preferably can be an inorganic material or it can be an organic material including a polymeric material. Useful inorganic coating materials may include those described above in the description of the microstructures. Useful organic materials include, for example, conductive polymers (e.g., polyacetylene), polymers derived from poly-p-xylylene, and materials capable of forming self-assembled layers.

As addressed below, the coating may be deposited onto the microstructured layer by vapor phase deposition methods, such as, for example, ion sputter deposition, cathodic arc deposition, vapor condensation, vacuum sublimation, physical vapor transport, chemical vapor transport, and metalorganic chemical vapor deposition. Preferably, the conformal coating material is a catalytic metal or metal alloy.

Key aspects of the formed acicular support nanostructures is that they be easily transferable from the initial substrate into the membrane or EBL surface to form the MEA catalyst electrode layer; they allow more catalyst particles to be deposited on the surface, preferably at least an 80 wt % ratio of catalyst particles to the combined weight of support and catalyst particles; they have sufficient number density and aspect ratio to provide a high value of surface area support for the catalyst, at least 3 to 5 times the planar area of the substrate but more preferably 10–15 times the planar area of the substrate; and the shape and orientation of the acicular support particles on the initial substrate are conducive to uniform coating with catalyst particles into the acicular morphology.

It has been documented in the art that vapor deposition of thin films on planar substrates at near-parallel incidence to the substrate surface can result in oriented discrete columnar growth, due to the effects of shadowing. This method is described in J. van de Waterbeemd, G. van Oosterhout, Philips Res. Repts., 22, 375–387 (1967) and cited in U.S. Pat. No. 5,645,929 as a method to obtain nanostructured thin films.

However, the present invention concerns an unexpected result: that deposition at near-normal incidence to a planar substrate, on which there is already a film of oriented discrete microstructures such as the acicular support particles of this case, can cause even much smaller scale discrete nanoscopic structures to grow out from the sides of the microstructures. Such a fractal-like structure should approach near maximum surface area. Since the electrochemical activity of the catalyst electrode is directly related to the active surface area of that catalyst and that area is directly related to the total geometric surface area, this effect is particularly relevant to the field of catalysis.

In the present invention, vacuum deposition may be accomplished by any suitable means known in the art. Devices useful for vacuum deposition typically comprise a vacuum chamber including a vacuum pump, a source or target, a substrate, and a means of generating the species to be deposited.

Chemical vapor deposition (CVD) processes can be useful for vacuum deposition of species generated by chemical reaction that occurs as reactants flow over a heated substrate and react at or near the substrate surface to deposit a film. CVD processes can include, for example, plasma-assisted CVD, photo-excited CVD, metalloorganic CVD, and related processes.

Preferably, physical vapor deposition (PVD) methods can be used in forming catalysts and catalyst structures of the present invention. PVD processes involve the deposition of atoms or molecules or a combination of these, typically by evaporation or sputtering in a vacuum. PVD processes can be characterized by the steps of (1) generating a depositing species by evaporation or sputtering using resistance, induction, electron-beam heating, laser-beam ablation, direct current plasma generation, radio-frequency plasma generation, molecular beam epitaxy, or similar means; (2) transport of the depositing species from the source to the substrate by molecular flow, viscous flow, plasma gas transport, or the like; and (3) film growth on the substrate, which can be assisted by electrical biasing of the substrate. With PVD a variety of substrate temperatures can be used to control the crystallization and growth mode of the material deposited.

Physical vapor deposition by sputtering is accomplished in a partial vacuum (between 13.3 to 1.33 Pa for a diode system and between 0.13 to 0.013 Pa for a magnetron system) when the target (usually a cathode) is bombarded with gas ions propelled by an electric field. The sputtering gas is typically a noble gas such as argon but the sputtering gas could include reactive elements that can be incorporated into the deposited film such as the deposition of nitrides, oxides and carbides. When the sputtering gas is ionized a glow discharge or plasma is produced. The gas ions are accelerated towards the target by an electric or electric and magnetic fields. Atoms from the target are ejected by momentum transfer and move across the vacuum chamber to be deposited on the substrate. Targets typically can be single element species.

Alloy deposition has been accomplished by coevaporation of a number of target elements, by evaporation or sputtering from a single alloy source, and by flash evaporation of pellets of a preformed alloy. PVD of alloys by methods known in the art can be unsatisfactory for a number of reasons: components of the alloy typically have different vapor pressures and sputtering yields, and will change with time so that the alloy produced on the target may not have the same composition as the target alloy; multiple-source coevaporation or sputtering methods typically lead to variations of alloy composition along the plane of the substrate; and flash evaporation, pulsed-laser evaporation, and electron-beam evaporation can lead to droplet ejection that causes major flaws on the substrate.

Depositing mixed metal or alloy catalysts by vacuum deposition methods may be accomplished by use of a single mixed catalyst source. However, due to differences in sputtering rates or evaporation/sublimation rates of the different elements, control of the stoichiometry can be difficult. Another means is to simultaneously co-deposit onto the same area of a substrate from multiple sources of the different elements. However, due to physical sizes of practical real equipment, the incidence angles that can be accessed are restricted and uniform deposition over the substrate is seriously compromised because different points are different distances from the sources. In addition, the sources can cross-contaminate each other.

The preferred approach to vacuum deposition of mixed metal or alloy catalysts according to the present invention is to sequentially deposit multiple layers of alternating elemental composition. Using the multi-layer, ultrathin-layer vacuum deposition approach to forming alloy or multi-element catalyst avoids the above difficulties. Also, it may be desirable to apply one material at different sputtering gas conditions than the other materials, e.g. reactive sputter deposition for one element, and non-reactive deposition for another.

The deposition rate is controlled by the source power settings and the throw distance between the target source and the substrate while the amount deposited per pass is controlled by the deposition rate and the duration of the pass. Hence, a fixed deposition amount per pass under the target is achievable with a multitude of combinations of source target power and drum speeds. The amount deposited per pass can vary from a low end of submonolayer discrete doping concentrations in the range of $10^{15}$ atoms/cm$^2$ or less, to the high end of hundreds of atomic layers. Depending on the thin film growth mechanism particular to the material deposited and the sputtering conditions, the material may nucleate as a continuous thin film or as discrete islands. In this way deposition can be engineered, as in atomic layer epitaxy, to control the catalyst structure and composition from the level of the unit cell to the multilayer morphology and from disordered films to superlattice-like structures in which both alloy and individual element crystal phases may be present. The amount of deposition per pass can vary from 1/10th of an atomic monolayer to many hundreds of monolayers, but is preferably between one and 100 monolayers and more preferably between 5 and 50.

Figure 4A:
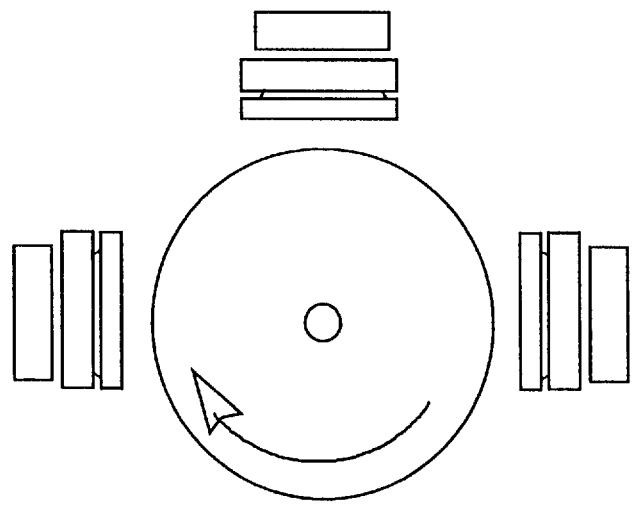
FIG. 4A is a schematic depiction of an apparatus for practice of the method of the present invention.
Figure 4B:
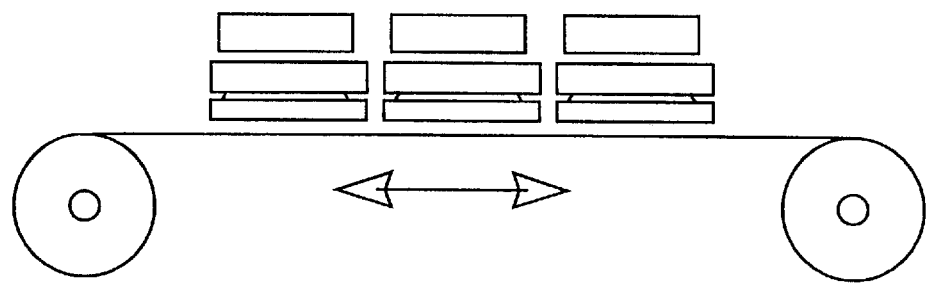
FIG. 4B is a schematic depiction of an apparatus for practice of the method of the present invention.

FIGS. 4A and 4B schematically illustrate two possible apparatus configurations for multi-layer vacuum deposition according to the present invention. In these embodiments, two or more vacuum deposition stations are positioned in front of a substrate support mechanism, which moves the substrate among separate deposition positions defined by the vacuum deposition stations. In FIG. 9B, the substrate, in the form of a semi-continuous web, is passed completely in a linear direction in front of a series of vapor sources (e.g. either sputtering targets or evaporation sources), to completely deposit one sequence of layers, then the direction is reversed to deposit another sequence, and then the cycle repeated the desired number of times. In either of these approaches, the ability to tailor the surface composition is enhanced over the other two ways to vacuum coat mixed metal catalyst layers discussed above.

In a preferred embodiment, the catalyst coatings are applied to the support particles by sputter deposition using the type of systems depicted schematically in FIGS. 4A and 4B. For continuous web coating, the linear approach depicted in FIG. 4B is preferred. The apparatus consists of a three-source magnetron sputtering system arranged around the outer circumference of a cylindrical chamber containing a 38 cm (15 inch) diameter rotating drum. The substrates were mounted on the drum and rotated sequentially past positions in front of the sputtering sources at rates of between 1 and 8 rpm. The sources are shielded such that the sample is not coated from any two fluxes at the same time. The rate of material deposition and speed of rotation of the substrate in front of the targets determines the individual layer thicknesses comprising the final catalyst particles. Any vacuum pump that can draw a sufficient vacuum may be used. One such vacuum pump is a Varian AV8 cryopump (Varian Associates, Lexington, Mass.), which can be used in conjunction with an Alactel 2012A rotary vane roughing pump (Alactel Vacuum Products, Hingham, Mass.). The cryopump may be partially isolated from the chamber by a butterfly valve. During deposition pressure was maintained at 0.28 Pa (2.1 millitorr) as the sputtering gas flow rate was controlled by MKS flow controllers (MKS Instruments Inc., Andover, Mass.). Any inert or reactive sputtering gases may be used. Preferably either argon or an argon, oxygen mix is used. Control of the oxygen stoichiometry can be achieved by varying the argon/oxygen flow ratio, in either Pt or Ru depositions. Any appropriate targets and power sources may be used. In one embodiment, three inch targets are used. (Target Materials Inc., Columbus, Ohio). The targets consist of 0.76 cm (0.3 inches) of target material bonded with indium to a copper backing, as is standard in the art of sputter deposition. In one embodiment, an Advanced Energy MDX 500 power supply (Advanced Energy Industries, Inc., Fort Collins, Colo.) is used in the constant power mode of the power supply.

The catalyst particle of the instant invention is novel in its shape, morphology or crystal habit, in the manner in which different chemical elements are distributed within the particle (in the case of alloy catalysts), in the way in which the particle shape or size changes as the catalyst loading is increased, in the way the particles are distributed on the supports, and in the way the surface composition may differ from the bulk composition. These characteristic differences are important because catalytic activity is generally known to be highly structure dependent. Thus, the chemical composition of a catalyst is not the only, nor often the most important characteristic determining its effectiveness in heterogeneous catalysis. Catalytic reactions take place on the surfaces of the catalysts, so the surface composition and surface structure, as opposed to the bulk composition and structure, are critically important.

The geometric surface area of the catalyst of the present invention can be estimated from FIG. 2 by counting the number of nanoscopic acicular catalyst particles extending out from the sides of and per unit area of the PR149 catalyst support particle, from the known length of the PR149 support particles and from the known number of such PR149 support particles per unit planar area of substrate. The PR149 support particles grow with a number density of about $3-4 \times 10^9/cm^2$ of substrate. These acicular whiskers have a shape approximated by a right parallelepiped about 1.5 microns long, 50 nm wide, and 25 nm thick. From FIG. 2 it can be estimated that each acicular catalyst particle occupies about 100 square nanometers of the surface area of each PR149 support whisker since there appear to be about 15 such particles per 150 nm of length of the whisker. In the sample of FIG. 2, about 1 micron length of the support particle is so covered by the catalyst particles. This provides about $1.5 \times 10^5$ $(nm)^2$ of geometric surface area per PR149 whisker for the smaller catalyst acicular particles. This means there are approximately 1,500 such catalyst particles coating the sides of each support particle. If, as FIG. 2 suggests, each such acicular catalyst particle is approximated as a cylinder, with diameter D and length L, then its geometric surface area is $\pi DL$, where $D\sim 8.3$ nm and $L\sim 33$ nm on average for such particles in FIG. 2. The surface area of each such particle then is about 860 $nm^2$. The total such catalyst geometric surface area per $cm^2$ of substrate is then $3 \times 10^9$ whiskers/$cm^2 \times 1,500$ catalyst particles/whisker$\times 860$ $nm^2$/catalyst particle or $3.9 \times 10^{15}$ $nm^2/cm^2$ or 39 $cm^2/cm^2$. For comparison, the geometric surface area for conventional spherical-shaped catalyst particles of known size distribution, supported on carbon particles, has been calculated per $cm^2$ of the electrode substrate the carbon is coated on, Mizuhata et al. (Electrochemical Society Proceedings 1995, Vol. 95-23, page 24). The areas are proportional to the catalyst loading per unit area of this substrate, and for a loading of 0.4 mg/$cm^2$, they obtain a surface area increase of 1.948 $cm^2/cm^2$ (see Table I in previous reference.) Hence, for about the same overall catalyst loading, the nanostructured catalysts of the present invention, illustrated FIG. 2, offer a geometrical surface area enhancement that is about 20 times larger than that of conventional catalyst particles.

The process and apparatus of the present invention allow selective modification of the stoichiometry, degree of alloying, degree of crystallinity and crystallite morphology of the bulk of the catalyst coating as well as the surface composition. These can be changed by varying the relative deposition rates of the individual layers, by varying the power, throw distance, or duration of any of the sources. Furthermore, the composition and structure of the catalyst can be altered by including additional components in the sputtering gas. Any known sputtering gas additives may be used, reactive or unreactive with the deposited material and whether incorporated into the catalyst as a constituent or dopant or not. Additives may include noble gasses, halogens, group VII elements, and preferably argon and oxygen. If sufficient isolation of the different vacuum deposition stations is provided, layered mixtures can be created which incorporate additives only in selected layers or which incorporate different additives in different layers.

In one embodiment of this use of additives, the process and apparatus of the present invention can be adapted to selective modification of the crystalline nature of the catalyst coating. In one preferred embodiment, a process to obtain an all-platinum nanoscopic catalyst can be changed from highly crystalline products to completely amorphous products by inclusion of oxygen in the sputtering gas composition. The same columnar or acicular growth morphology of catalyst particles is seen for the amorphous catalyst particles as it is for the crystalline catalyst particles. FIG. 3 shows such nodular growth of amorphous $PtO_x$ coated onto a PR149 support particle. Preferably at least a 1:1 ratio of oxygen-:argon is used with a platinum catalyst, and more preferably a 10:1 ratio. Furthermore, layered mixtures of crystalline and amorphous catalysts can be created by including oxygen in the sputtering gas composition of some but not all of the vacuum deposition stations if there is sufficient isolation of the different vacuum deposition stations.

The process and apparatus of the present invention allow the production of catalyst particles having a preferred final layer composition independent of the bulk composition. This can be achieved by altering the deposition conditions during deposition of the final layers. The new conditions are introduced for at least the very last deposition step, and preferably for the last 1–50 and more preferably 1–20 equivalent monolayer thicknesses of deposited material. The new conditions may include turning off any one of the operating deposition stations so as to omit the catalyst deposited therefrom, turning on a new deposition station so as to add a new catalyst, turning up or down the power level at any deposition station, adding or subtracting an additive from the sputtering gas of any of the stations, or any other change which will provide a desirable change in the final layer composition or structure.

One preferred embodiment shows improved CO tolerance when used in an anode in hydrogen fuel cell use. The preferred CO tolerant embodiment may be made by the methods described above, where alternate layers of Pt and Ru are deposited with use of an Ar/O mixture as a sputtering gas. Preferably, Ar/O ratios of between 1:1 and 1:10 are used, and most preferably 1:2. The catalyst principally comprises alternating layers of Pt and Ru which also incorporate oxygen, but may additionally comprise other elements that do not deleteriously affect the catalyst properties. The bulk catalyst composition is preferably between about 2:1 and about 1:5 atomic ratio of Pt:Ru. The bulk catalyst composition is more preferably between about 1:1 and about 1:2 atomic ratio of Pt:Ru. The growth surface composition is made to differ from the bulk composition by reducing or eliminating Ru deposition, or by increasing Pt deposition, during the last deposition steps, preferably the last 1–10 passes and most preferably the last 1–3 passes. Most preferably, Ru deposition is eliminated during the last deposition steps. Thus the growth surface composition is richer in Pt than the bulk composition; i.e., it comprises, for each part Pt, less than one part Ru. More preferably the growth surface comprises, for each part by weight Pt, less than about ⅔ part Ru and more preferably less than about 40%.

This invention is useful in electrochemical devices such as fuel cells, batteries, electrolyzers, electrochemical reactors such as chlor-alkali separation membranes, or gas, vapor or liquid sensors, using membrane electrodes optimized for the immediate purpose. This invention is useful in electrochemical devices where CO tolerance is advantageous.

Objects and advantages of this invention are further illustrated by the following examples, but the particular materials and amounts thereof recited in these examples, as well as other conditions and details, should not be construed to unduly limit this invention.

EXAMPLES

In the following examples, the microstructures employed as catalyst supports were made according to the process described in U.S. Pat. No. 5,338,430, incorporated herein by reference. Nanostructured perylene red (PR149, American Hoechst Corp., Somerset, N.J.) films on polyimide substrates were made using the techniques described in U.S. Pat. Nos. 4,812,352 and 5,039,561 by thermal evaporation and vacuum annealing of the organic pigment C.I. Pigment Red 149, i.e., N,N'-di(3,5-xylyl)perylene-3,4:9,10-bis (dicarboximide). After deposition and annealing, highly oriented crystal structures were formed with large aspect ratios, controllable lengths of about 0.5 to 2 micrometers, widths of about 0.03–0.05 micrometer and areal number density of approximately 30 whiskers per square micrometer, oriented substantially normal to the polyimide substrate. These microstructures are nonconductive and separate readily from the polyimide substrate when pressed into an ICM.

In the following examples, Pt and Ru catalyst coatings were applied to the PR149 support particles by sputter deposition using a vacuum system schematically depicted in FIG. 4A. The apparatus consisted of a three-source magnetron sputtering system arranged around the outer circumference of a cylindrical chamber containing a 38 cm (15 inch) diameter rotating drum. The substrates were mounted on the drum and rotated sequentially past positions in front of the sputtering sources at rates of between 1 and 8 rpm. The sources were shielded such that the sample could not be coated from any two fluxes at the same time. The vacuum pump used was a Varian AV8 cryopump (Varian Associates, Inc., Lexington, Mass.) equipped with an Alactel 2012A rotary vane roughing pump (Alactel Vacuum Products, Hingham, Mass.). The cryopump was partially isolated from the chamber by a butterfly valve. During deposition, pressure was maintained at 0.28 Pa (2.1 millitorr) as the sputtering gas flow rate was controlled by MKS flow controllers (MKS Instruments, Inc., Andover, Mass.). The sputtering gases used were either argon or an argon/oxygen mix. Control of oxygen stoichiometry was achieved by varying the argon/oxygen flow ratio in both Pt and Ru depositions. Three inch targets (Target Materials, Inc., Columbus, Ohio) were used, consisting of 0.76 cm (0.3 inches) of target material bonded with indium to a copper backing. An Advanced Energy MDX 500 power supply (Advanced Energy Industries, Inc., Fort Collins, Colo.) was used in the constant power mode for each deposition.

Measurement of catalyst loading was done by a simple gravimetric method after deposition. A sample of the polyimide-supported nanostructured film layer was massed using a digital balance accurate to about one microgram. Then the nanostructured layer was wiped off the polyimide substrate using a paper tissue or linen cloth, and the substrate was remassed. Because a preferred property of the nanostructured catalyst support is that it transfer easily and completely to the ion exchange membrane, it also was easily removed by simple wiping with a cloth. The mass per unit area of the catalyst support particles, without Pt, was also measured this way. Nanostructures for use in the anode (the hydrogen reaction side of the fuel cell) were made as indicated in each example, below. Nanostructures for use in the cathode (the oxygen reaction side of the fuel cell) were made by deposition of Pt using argon sputtering gas with a carbon precoat of approximately 0.02 mg/cm$^2$ on the nanostructure. The catalyst loadings varied from 0.09 to 0.425 mg/cm$^2$.

The ion conducting membranes used were perfluorinated sulfonic acid materials, specifically, Nafion™ 117 membranes (DuPont Chemicals, Wilmington, Del., available from ElectroChem, Inc., Woburn, Mass., and Aldrich Chemical Co., Inc., Milwaukee, Wis.).

Before use, the Nafion membrane was pretreated by sequentially immersing into a) boiling water for one hour, b) boiling 3% $H_2O_2$ for one hour, c) boiling ultra pure $H_2O$ for 1 hour, d) boiling 0.5M $H_2SO_4$ for one hour, e) boiling ultra pure DI $H_2O$ for one hour. The Nafion was then stored in ultrapure DI water until use. Prior to forming an MEA the Nafion was dried by laying it between several layers of clean linen cloth at 30° C. for 10–20 minutes.

Each MEA was made using a static pressing procedure which consisted of transfer of the catalyst-coated nanostructured elements into the Nafion 117 membrane by pressing under vacuum at 130° C. and a pressure of 160 MPa (11.6 tons per square inch). For preparation of an MEA with 5 cm$^2$ of active area by a static pressing method, two 5 cm$^2$ square pieces of the nanostructured elements on a polyimide substrate—one for the anode, one for the cathode—were placed on either side of the center of a 7.6 cm×7.6 cm Nafion 117 membrane. A 50 micrometer thick, 7.6 cm×7.6 cm sheet of polyimide was placed on each side of the catalyst coated substrate/Nafion/catalyst coated substrate sandwich. This assembly was then placed between two steel shim plates and pressed under a low grade vacuum at 130° C. and a pressure of 160 MPa (11.6 tons per square inch) using a Carver lab press (Carver Inc., Wabash, Ind.). A low grade vacuum (less than about 2 Torr) was applied to partially remove air from the stack just prior to applying the maximum pressure. The original 5 cm$^2$ polyimide substrates were then peeled away leaving the catalyst attached to the surface of the Nafion membrane.

Both catalyst electrodes of the MEA were covered with 0.4 cm (0.015") thick ELAT™ electrode backing material (E-tek, Inc., Natick, Mass.), and centered in a 5 cm$^2$ square hole, cut to match the catalyst area, of a 250 micrometers thick Teflon™ coated fiberglass gasket (The Furon Co., CHR Division, New Haven, Conn.). The Elat electrode backing material is designated as carbon only, i.e., it contains no catalyst. The MEA was then mounted in a test cell station (Fuel Cell Technologies, Inc., Albuquerque, N.M.). The test station includes a variable electronic load with separate anode and cathode gas handling systems to control gas flow, pressure and humidity. The electronic load and gas flow are computer controlled.

Fuel cell polarization curves were obtained the under the following test parameters: electrode area, 5 cm$^2$; cell temperature, 75° C., anode gas pressure (gauge), 62.0 kPa (9 psig); anode gas flow rate, 75–150 standard cc/min; anode humidification temperature, 105° C.; cathode gas pressure (gauge), 414 kPa (60 psig); cathode flow rate, 600 standard cc/min; cathode humidification temperature, 65° C. Humidification of the gas streams was provided by passing the gas through sparge bottles maintained at the stated temperatures. Each fuel cell was brought to operating conditions at 75° C. under hydrogen and oxygen flows. Test protocols were initiated after 24 hours of operation and the following variables were measured: anode pressure, anode flow, cathode pressure, cathode flow, cell temperature and CO concentration.

Surface stoichiometry of a catalyst deposition was determined by X-ray Photoelectron Spectroscopy (XPS), using a Hewlett-Packard Model 5950A ESCA system (Hewlett-Packard Co., Palo Alto, Calif.) equipped with an Al $K_\alpha$ monochromator. XPS is a non-damaging method of determining the elemental composition of the surface of materials based on measuring the kinetic energy of photoemitted electrons from atomic core levels through soft x-ray excitation. Emitted electrons can be detected at various angles relative to the sample surface; those detected at angles approaching 0° indicate elemental composition closest to, e.g., approximately the first 5 Å of, the surface. Samples used came from deposition on a witness slide (see Example 1, below).

Samples were examined by X-ray diffraction employing a Philips vertical diffractometer (reflection geometry), copper $K_\alpha$ radiation, and proportional detector registry of the scattered radiation (Philips Electronic Instruments Co., Mahwah, N.J.). The diffractometer was equipped with variable entrance slits, fixed exit slits, and graphite diffracted beam monochromator. Samples were mounted on glass supports using double coated tape. Step-scans were conducted within the 35 to 90 degree (2θ) scattering angle range using a 0.06 degree step size and 16 second dwell time. Generator settings were 40 kV and 35 mA. Background scattering due to the polymer matrix and glass support was removed by subtraction of a data set obtained from a representative sample of Nafion™ scanned in a similar manner. Analysis of the resulting data was performed using Philips PC-APD software. Apparent crystallite sizes were determined from observed peak breadths, taken as the peak full width at half maximum (FWHM), after correction for instrumental broadening and use of the Scherrer Equation.

Bulk composition was determined by the use of energy dispersive analytical fluoresence (EDAX) methods. Measurements were done using an Amway scanning electron microscope with a silicon based x-ray detector array using Tracor Northern counting electronics and software. Samples used came from deposition on a witness slide (see Example 1, below) or from whiskers removed from the substrate using dental adhesive. The electron beam of the scanning electron microscope produces x-rays when it strikes the samples. The energy of the x-rays is dependent on the atomic electronic structure of the material it strikes. Data was taken for x-ray energies between 0 and 10 keV over a 100 seconds interval at a fixed beam current. Fitting the data, subtracting the background, a ratio of Pt-La peak (2.051 eV) and the Ru-La peak (2.558 eV) gives the atomic ratio of the bulk material.

EXAMPLE 1

Catalyst Preparation

An anode catalyst composition having a 50:50 bulk atomic ratio of Ru:Pt and a surface composition of 63:0:34 Pt:Ru:O (Sample 1–9) was prepared by mounting a 50 micron polyimide film on which was deposited PR149 nanostructured catalyst support elements, the preparation of which is described above, on a 38 cm diameter rotatable drum mounted in a vacuum system as described above and illustrated in FIG. 4A. An additional small piece of polyimide was mounted in the system to be used as a witness slide for XPS and EDAX measurements. The system was roughed down to 0.27 Pa by a rotary vane pump, at which point it was closed off and a gate valve was opened to a cryopump. The system was pumped down to approximately 1.3×10$^{-3}$ Pa before a butterfly valve between the gate valve and the cryopump was positioned so that a maximum chamber pressure was obtained, usually in 0.027 Pa range. The purpose of the butterfly valve was to partially isolate the cryopump from the higher pressures of the chamber. Mass flow controllers were set at 8 sccm for argon sputtering gas and 16 sccm for oxygen sputtering gas. The flow of each gas was adjusted to reach a steady state chamber pressure of 0.28 Pa with the flow ratio being maintained at 2:1 oxygen:argon. Next, power supplies for each source were set in the constant power mode with the Pt source at 175 Watts and Ru source at 285 Watts. The drum was rotated at 3 rpm. Both power sources were engaged simultaneously. Some minor adjustment of the gas flows were required during the deposition to maintain the 0.28 Pa pressure. The deposition was continued for 10 minutes or 30 passes under each source, at which point the Ru source was turned off. The Pt source remained on for one minute, which equates to three additional passes with no Ru flux. Subsequent characterization of the film showed a mass loading of 0.09 mg/cm$^2$. Bulk composition of Pt:Ru was determined by energy dispersive analytical x-ray to be 50:50. Apparent crystallite sizes were determined to be 5 nm for (111) lattice plane, 3.3 nm for (220) lattice plane and 3.8 nm for (311) lattice plane with a high degree of alloying by x-ray diffraction analysis. XPS analysis of the witness slides showed a Ru:Pt ratio of 0.037 at 38° takeoff and no evidence of Ru at 18° takeoff, indicating that the surface comprised only $PtO_x$.

Similarly, a number of catalyst materials were prepared, wherein the ratio of Ru to Pt was varied, along with the oxygen:argon ratio. Results of the preparations are shown in Table I.

TABLE I

| Sample | Bulk Ru/Pt atomic ratio | Ru/Pt ratio @ 38° | Ru/Pt ratio @ 18° | Surface Oxygen Percentage @ 38° |
|---|---|---|---|---|
| 1-1 | 54:46 | 0.260 | 0.271 | 38 |
| 1-2 | 54:46 | 1.040 | 1.330 | 47 |
| 1-3 | 56:44 | 0.926 | 0.962 | 48 |
| 1-4 | 56:44 | 1.292 | 1.381 | 45 |
| 1-5 | 55:45 | 0.131 | 0.100 | 30 |
| 1-6 | 56:44 | 0.141 | 0.134 | 64 |
| 1-7 | 50:50 | 0.319 | 0.286 | 32 |
| 1-8 | 50:50 | 0.114 | 0.147 | 37 |
| 1-9 | 50:50 | 0.037 | 0.000 | 34 |

As can be seen from the data of Table I, Sample 1–9 corresponds to the detailed description of the above procedure. The data of Table I show that, for a given bulk composition, the surface composition of planar witness samples (i.e. non-microstructure samples) was made either Pt- or Ru-rich, specifically by choosing the last source to be directed at the target as well as the number of times the target was exposed to the last source. For example, for Samples 1–7, 1–8, and 1–9, the target was exposed, respectively, to 1, 2, and 3 additional passes under the Pt source. Oxygen content of the catalyst surface can also be controlled in this method. For example, the oxygen:argon ratio of Sample 1–6 was 10:1, whereas the ratio for Sample 1–7 was 4:1, which is reflected in the surface percent oxygen content of each sample. This illustrates control of growth surface composition.

EXAMPLE 2
$PtRu$ vs $PtRuO_x$ for High CO Tolerance

Figure 5:
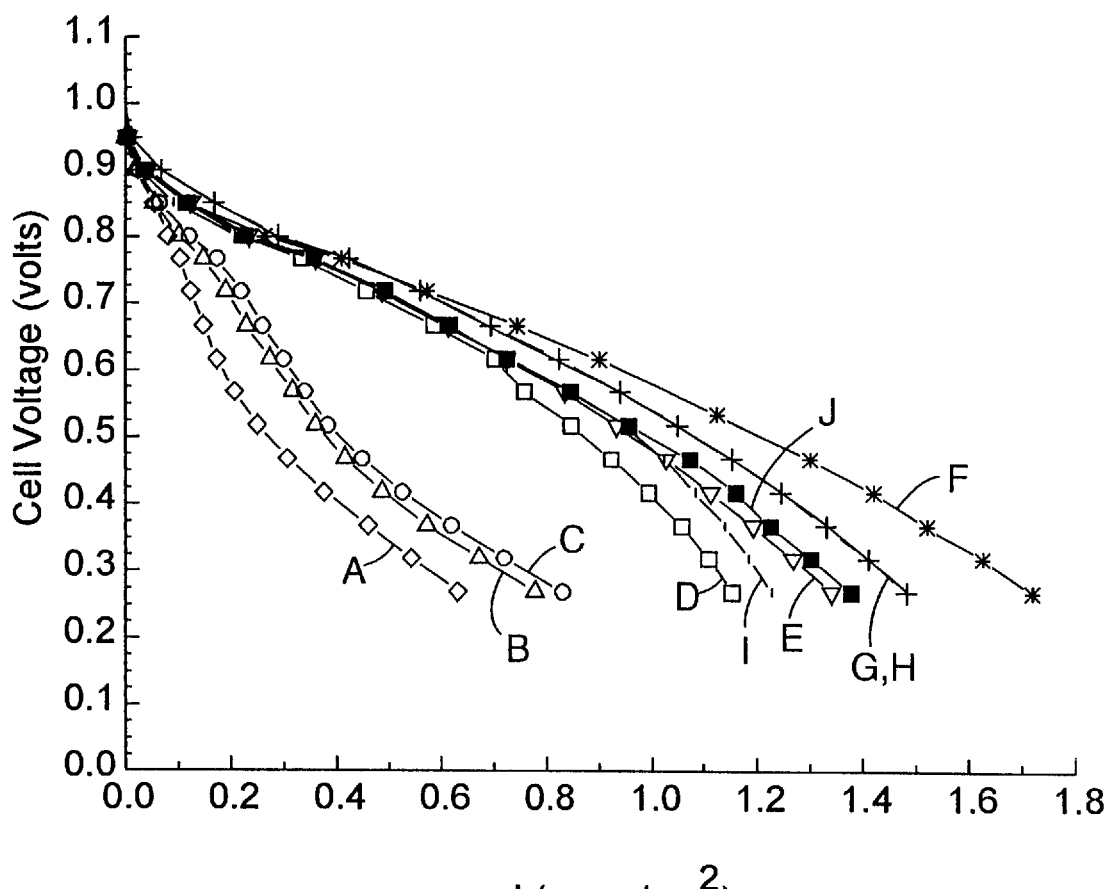
FIG. 5 is a graph showing current density vs. cell voltage for ten fuel cells of the present invention.

Ten MEAs were prepared and tested as described above, with varying anode catalyst compositions. Compositions are given in Table III. FIG. 5 compares polarization curves from eight samples having a range of Pt/Ru and $PtRuO_x$ composition, exposed to 31–37.5 ppm CO in $H_2$, along with the pure hydrogen response from two of the samples. The data of FIG. 5 show the differences in CO tolerance between using PtRu and $PtRuO_x$ compounds for fuel cell catalysts. The deposition method of the invention allows control of the value of surface oxygen x between 1 and 2. In all cases where oxygen was used as a sputtering gas, an improvement in cell performance in the presence of CO over sputtering in pure Argon can be seen. Surprisingly, the most tolerant anode compositions were extremely Pt rich, while those in between, i.e., near 50:50 Pt/Ru, showed the worst performance. This is contrary to the published results with conventional carbon particle supported Pt/Ru catalysts.

TABLE III

| Sample | Pt/Ru/O |
|---|---|
| 1-A | 35/65/0 |
| 1-B | 50/50/0 |
| 1-C | 25/26/49 |
| 1-D | 53/18/29 |
| 1-E | 57/5.7/37 |
| 1-F | 53/18/29 |
| 1-G | 35/65/0 |
| 1-H | 42/22/36 |
| 1-I | 34/30/36 |
| 1-J | 42/22/36 |

EXAMPLE 3
Pt Rich Growth Surfaces

Catalyst structures of the invention were prepared having a bulk Ru/Pt ratio of 50:50 with varying amounts of Pt on the outer growth surface, as measured by XPS at 38° take off angle. Fuel cells comprising MEAs using the catalyst structures were assembled, and polarization curves obtained as described above using, on the anode side, hydrogen gas containing 35, 100, and 322 ppm CO. Results are shown in Table IV. In each case, mass loading was 0.09 mg/cm$^2$.

TABLE IV

| Sample | Delta V 35 ppm CO | Delta V 100 ppm CO | Delta V 322 ppm CO |
|---|---|---|---|
| 1-7 | 180 mV | NA | NA |
| 1-8 | 0 | 0 | 320 mV |
| 1-9 | 0 | 0 | 0 |

In Table IV, "Delta V" represents the cell voltage drop compared to the pure hydrogen case at the current density of 0.7 V for each MEA comprising the catalyst samples prepared as described in Example 1 on exposure to CO at the concentration shown. As shown in Table I, Sample 1–9 has at least three times as much Pt and essentially no Ru in its outermost surface, as compared to Sample 1– 7, which has a Ru/Pt ratio of 0.319. The data of Table IV show that anode catalysts of the invention having a bulk 50:50 ratio of Pt:Ru and a high Pt content in their outermost layers were not affected when challenged with 322 ppm CO.

EXAMPLE 4

This example and the following comparative example demonstrate the improved CO tolerance of the nanostructured catalysts over the conventional carbon supported catalysts, when applied to an MEA in the same way without additional ionomer and tested under the same conditions.

A nanostructured anode catalyst was prepared as follows. A PR149 nanostructured film was prepared on a polyimide substrate as described above and sputter coated in an Ar/oxygen mixture with alternating layers of Pt and Ru, to have a nominal Pt/Ru bulk composition ratio of 35/65 wt %, using a 38 cm diameter rotatable drum mounted in a vacuum system as described above and illustrated in FIG. 4A. Only the Pt target was operated the last two revolutions, to give a Pt rich surface composition, nominally determined by XPS from witness slides to be Pt/Ru/O 57:6:37 wt %. The mass loading was determined to be about 0.09 mg/cm$^2$.

A cathode catalyst was prepared as a second nanostructured film of PR149 whiskers sputter coated with 0.01 mg/cm$^2$ of carbon first, then 0.37 mg/cm$^2$ of Pt.

These nanostructured films were used as the anode and cathode catalysts to prepare a 5 cm$^2$ MEA as described above by hot press transfer of the catalysts into the opposing surfaces of a Nafion 117 membrane. The nanostructured catalyst support particles were embedded directly into the Nafion without any additional ionomer added to either the films or the Nafion membrane.

The MEA was tested in a fuel cell test apparatus as described above, by exposing the anode to a mixture of 100 ppm CO in hydrogen. The anode/cathode gauge pressures were 62/414 KPa (9/60 psig) hydrogen/oxygen, at 75/600 sccm flow rates respectively and 105°/65° C. sparge bottle humidification temperatures respectively. The cell temperature was 75° C. The cell was operated on pure hydrogen until its performance stabilized, then switched to 100 ppm CO in hydrogen and the cell current at 0.7 volts monitored over time while operating the test station in a constant voltage mode. No polarization scanning was done during the test period of more than two hours. The current density versus time is indicated in FIG. 6 which shows that the performance decreased from about 0.52 amps/cm$^2$ to about 0.45 amps/cm$^2$ during the first 20 minutes, but then fell much more gradually over the next two hours to about 0.425 amps/cm$^2$. This performance is shown in FIG. 6 to be far superior to an identically tested MEA having a commercial carbon supported PtRu catalyst on the anode at much higher mass loading.

EXAMPLE 5 (COMPARATIVE)

A catalyzed gas diffusion electrode consisting of 20% by wt. Pt:Ru (1:1 atomic ratio) catalyst on Vulcan XC-72 carbon particles coated on ELAT™ carbon cloth electrode backing was obtained from E-tek, Inc. As delivered, no additional ionomer was added to the catalyst or the ELAT™ membrane. The mass loading was 0.37 mg/cm$^2$. A 5 cm$^2$ MEA was prepared by placing the catalyst side of a square piece of the catalyzed membrane against the center of a Nafion 117 membrane to act as an anode. A 5 cm$^2$ piece of the Pt-coated nanostructured film prepared in Example 4 was placed against the opposite side of the Nafion membrane as the cathode. This sandwich was hot pressed using the same procedures and conditions as used to transfer the catalysts in the previous examples. This MEA was tested for CO tolerance at 100 ppm, using the same conditions and test protocol as used in Example 4. FIG. 6 shows the current density versus time at 0.7 volts from this comparative MEA. The data of FIG. 6 show that, despite the much higher loading of 0.37 mg/cm$^2$, the comparative carbon particle supported PtRu catalyst's current density dropped precipitously from 0.43 amps/cm$^2$ to 0.025 amps/cm$^2$ in the first 20 minutes of CO exposure, and then more gradually continued to degrade to about 0.02 amps/cm$^2$ over the next two hours. This performance was far inferior to that of the nanostructured film anode catalyst of the present invention.

EXAMPLE 6

This example demonstrates that the mixed Pt/Ru acicular nanoscopic catalyst particles are true alloys, that varying alloy phases ( PtRu and PtRu$_2$) can be obtained, and that mixed alloy phases can be obtained in the same sample, using the methods of the present invention.

Films of PR149 microstructure support particles on polyimide substrates were mounted on the rotatable drum of the sputtering vacuum system described above. The PR149 whiskers were approximately 1.5 micrometers long. The drum was rotated at 41.25 seconds per revolution, the Ar sputtering pressure was 0.29 Pa (2.2 mTorr) for each sample. The sputtering target powers and times were varied in the samples below to obtain different alloy compositions. For each sample, materials for x-ray diffraction characterization were prepared as single electrode MEAs by hot pressing, as described above, about 1 cm$^2$ of catalyst coated whiskers into Nafion 117. The x-ray diffraction (XRD) line spectra were background-corrected by subtraction of the scattering intensity from a plain Nafion 117 sample. The catalyst diffraction peaks were software-fitted to extract information on the existence and type of alloys forming the catalyst particles.

For sample 1, the Pt target was operated at a power of 175 watts, the Ru target at 500 watts for 25 minutes. Under these conditions, from the measured deposition rates of each target, the catalyst mass loading was calculated to be 0.13 mg/cm$^2$ of Pt and 0.13 mg/cm$^2$ of Ru. Energy dispersed x-ray (EDAX) fluorescence in an SEM indicated a bulk composition of 35:65 at % Pt:Ru, which is consistent with the mass loadings, given the difference in density of Pt (21.45 g/cc) and Ru (12.2 g/cc). XRD showed the catalyst particles consisted of two crystalline phases. One phase was an alloy with a Pt face-centered cubic (FCC)-type crystal structure containing approximately 70 atom % Ru, implying a nominal PtRu$_2$ alloy composition. The second phase was pure Ru (with some evidence of possible Pt substitution). The crystallite size of the first phase based on (111) diffraction order was 130 Å. That from the second phase, based on a Ru(111) peak was 128 Å.

For sample 2, the Pt target was operated at a power of 185 watts, the Ru target at 300 watts for 25 minutes. Under these conditions the catalyst mass loading was calculated to be 0.14 mg/cm$^2$ of Pt and 0.08 mg/cm$^2$ of Ru. EDAX fluorescence in an SEM indicated a bulk composition of 50:50 atom % Pt:Ru. XRD showed the catalyst particles consisted of a single crystalline phase, an alloy with a Pt FCC-type crystal structure containing approximately 54 atom % Ru, implying a nominal PtRu alloy composition. The crystallite size of the alloy phase based on (111) diffraction order was 114 Å.

For samples 3–8, two sets of similar samples were prepared using different target powers and deposition times to obtain mixed alloys of different mass loadings. Table V summarizes the conditions and resultant alloy compositions along with those from samples 1 and 2.

TABLE V

| Sample | Pt power Watts | Ru power Watts | Duration min. | Total loading mg/cm$^2$ | Pt:Ru atom % | Phases | Alloy d(111) |
|---|---|---|---|---|---|---|---|
| 1 | 175 | 500 | 25 | 0.26 | 35:65 | PtRu$_2$ + Ru | 130 Å |
| 2 | 185 | 300 | 25 | 0.22 | 50:50 | PtRu | 114 Å |

TABLE V-continued

| Sample | Pt power Watts | Ru power Watts | Duration min. | Total loading mg/cm² | Pt:Ru atom % | Phases | Alloy d(111) |
|---|---|---|---|---|---|---|---|
| 3 | 175 | 450 | 35 | 0.34 | 35:65 | PtRu₂ + Ru | 105 Å |
| 4 | 175 | 450 | 17.5 | 0.165 | 35:65 | PtRu₂ + Ru | 72 Å |
| 5 | 175 | 450 | 6 | 0.046 | 35:65 | PtRu₂ + Ru | 38 Å |
| 6 | 175 | 285 | 35 | 0.23 | 50:50 | PtRu | 65 Å |
| 7 | 175 | 285 | 17 | 0.14 | 50:50 | PtRu | 55 Å |
| 8 | 175 | 285 | 6 | 0.044 | 50:50 | PtRu | 36 Å |

The data of Table V show that, in each set of four samples having the same ratio of Pt:Ru, the same alloy compositions are obtained for all the mass loadings.

Various modifications and alterations of this invention will become apparent to those skilled in the art without departing from the scope and principles of this invention, and it should be understood that this invention is not to be unduly limited to the illustrative embodiments set forth hereinabove. All publications and patents are herein incorporated by reference to the same extent as if each individual publication or patent was specifically and individually indicated to be incorporated by reference.

We claim:

1. Nanostructured elements comprising acicular microstructured support whiskers bearing acicular nanoscopic catalyst particles.

2. The nanostructured elements according to claim 1, wherein the acicular nanoscopic catalyst particles comprise alternating layers of different catalyst materials.

3. The nanostructured elements according to claim 2, wherein the acicular nanoscopic catalyst particles comprise alternating layers of Pt-containing and Ru-containing catalyst.

4. The nanostructured elements according to claim 2, wherein different catalyst materials comprising the alternating layers possess different degrees of crystallinity.

5. The nanostructured elements according to claim 2, wherein different catalyst materials comprising the alternating layers possess different degrees of alloying.

6. A method of making the nanostructured elements according to claim 2 comprising the step of repeated alternate vacuum deposition of at least two different catalyst materials onto acicular microstructured support whiskers.

7. The nanostructured elements according to claim 1, wherein the composition of the growth surface of the acicular nanoscopic catalyst particles differs from the bulk composition of the acicular nanoscopic catalyst particles.

8. The nanostructured elements according to claim 7, wherein the acicular nanoscopic catalyst particles comprise Pt and Ru.

9. The nanostructured elements according to claim 8, wherein the composition of the growth surface of the acicular nanoscopic catalyst particles comprises a higher Pt/Ru ratio than the bulk composition of the acicular nanoscopic catalyst particles.

10. Carbon monoxide tolerant nanostructured elements comprising the nanostructured elements according to claim 9, wherein the ratio of Pt to Ru by weight on the growing surface of the catalyst is greater than 1:1.

11. The carbon monoxide tolerant nanostructured elements according to claim 10, wherein the ratio of Pt to Ru by weight in the bulk of the catalyst material is between about 1:2 and about 1:1.

12. A membrane electrode assembly comprising the carbon monoxide tolerant nanostructured elements according to claim 10.

13. A fuel cell comprising the membrane electrode assembly according to claim 12.

14. A method of making the nanostructured elements according to claim 7 comprising the step of repeated alternate vacuum deposition of at least two different catalyst materials onto acicular microstructured support whiskers followed by the step of vacuum deposition of at least one but fewer than all of said catalyst materials onto said acicular microstructured support whiskers.

15. The nanostructured elements according to claim 1, wherein the catalyst material additionally comprises oxygen and is amorphous.

16. A membrane electrode assembly comprising the nanostructured elements according to claim 1.

17. A electrochemical cell comprising the membrane electrode assembly according to claim 16.

18. A carbon monoxide tolerant catalyst comprising Pt and Ru, wherein the ratio of Pt to Ru by weight in the bulk of the catalyst is less than 1:1 and the ratio of Pt to Ru by weight on the surface of the catalyst is greater than 1:1.

19. The carbon monoxide tolerant catalyst according to claim 18, wherein the ratio of Pt to Ru by weight on the surface of the catalyst is greater than 3:2.

20. A fuel cell comprising the carbon monoxide tolerant catalyst according to claim 18.

* * * * *